(12) United States Patent
Kirichenko

(10) Patent No.: US 7,508,230 B2
(45) Date of Patent: Mar. 24, 2009

(54) DIGITAL PROGRAMMABLE PHASE GENERATOR

(75) Inventor: Alexander F. Kirichenko, Pleasantville, NY (US)

(73) Assignee: Hypres, Inc., Elmsford, NY (US)

( * ) Notice: Subject to any disclaimer, the term of this patent is extended or adjusted under 35 U.S.C. 154(b) by 450 days.

(21) Appl. No.: 11/243,020

(22) Filed: Oct. 4, 2005

(65) Prior Publication Data

US 2007/0075729 A1    Apr. 5, 2007

(51) Int. Cl.
H03K 19/195    (2006.01)
H03K 3/38    (2006.01)

(52) U.S. Cl. .............................. 326/3; 326/2; 327/528

(58) Field of Classification Search .................. 326/2, 326/3; 327/528; 341/133
See application file for complete search history.

(56) References Cited

U.S. PATENT DOCUMENTS 6,331,805 B1 * 12/2001 Gupta et al. ............. 331/107 S
6,734,699 B1 * 5/2004 Herr et al. ...................... 326/1

OTHER PUBLICATIONS

K.K. likharev and V.K. Semenov, RSFQ Logic/Memory Family: A new josephus In-Junction Technology For Sub-Terahertz-Clock-Frequency Digital Systems, IEEE, vol. 1, No. 1, Mar. 1991, pp. 9-18.

S. Polonski, V. Semenov and A. Kirichenko, Single Flux, Quantum B Flip-Flop and Its Possible Applications, IEEE, vol. 4, No. 1, Mar. 1994, pp. 9.

A. Shevchenko, A. Kiritchenko, S. Polonsky and P. Shevchenko, New Elements of the RSFQ Logic/Memory Family Part 2), Department of Physics, Moscow State University, Moscow, 4 pages, no date.

A. Hirichenko and V. Semenov, 4-bit Rapid Single-Flux-Quantum Decoder, IEEE, vol. 5, No. 2, Mar. 1995, pp. 2857-2860.

A. Kirichenko, S. Sarwana, D. Gupta and D. Yohannes, Superconductor Digital Receiver Components, IEEE, vol. 15, No. 2, Jun. 2005, pp. 249-254.

L. Fei, Frequency Divider Design Strategies, Broadband Technology, Mar. 2005, pp. 18-26.

B. Gilbert, "A Precise Four Quadrant Multiplexer With Subnanosecond Response," IEEE, vol. SC-3, pp. 365-373, Dec. 1968.

* cited by examiner

*Primary Examiner*—Daniel D Chang
(74) *Attorney, Agent, or Firm*—Milde & Hoffberg, LLP

(57) ABSTRACT

A programmable phase shifter is constructed of Rapid Single Flux Quantum (RSFQ) logic elements. The logic elements may include an RSFQ inverter and an RSFQ T flip-flop. A digital word comprising N bits is used to control the amount of phase shift and the phase shifter selectively imparts a respective phase shift for any of $2^N$ states that can be represented by the digital word. The RSFQ logic elements utilize Josephson junctions which operate in the superconducting temperature domain.

12 Claims, 5 Drawing Sheets

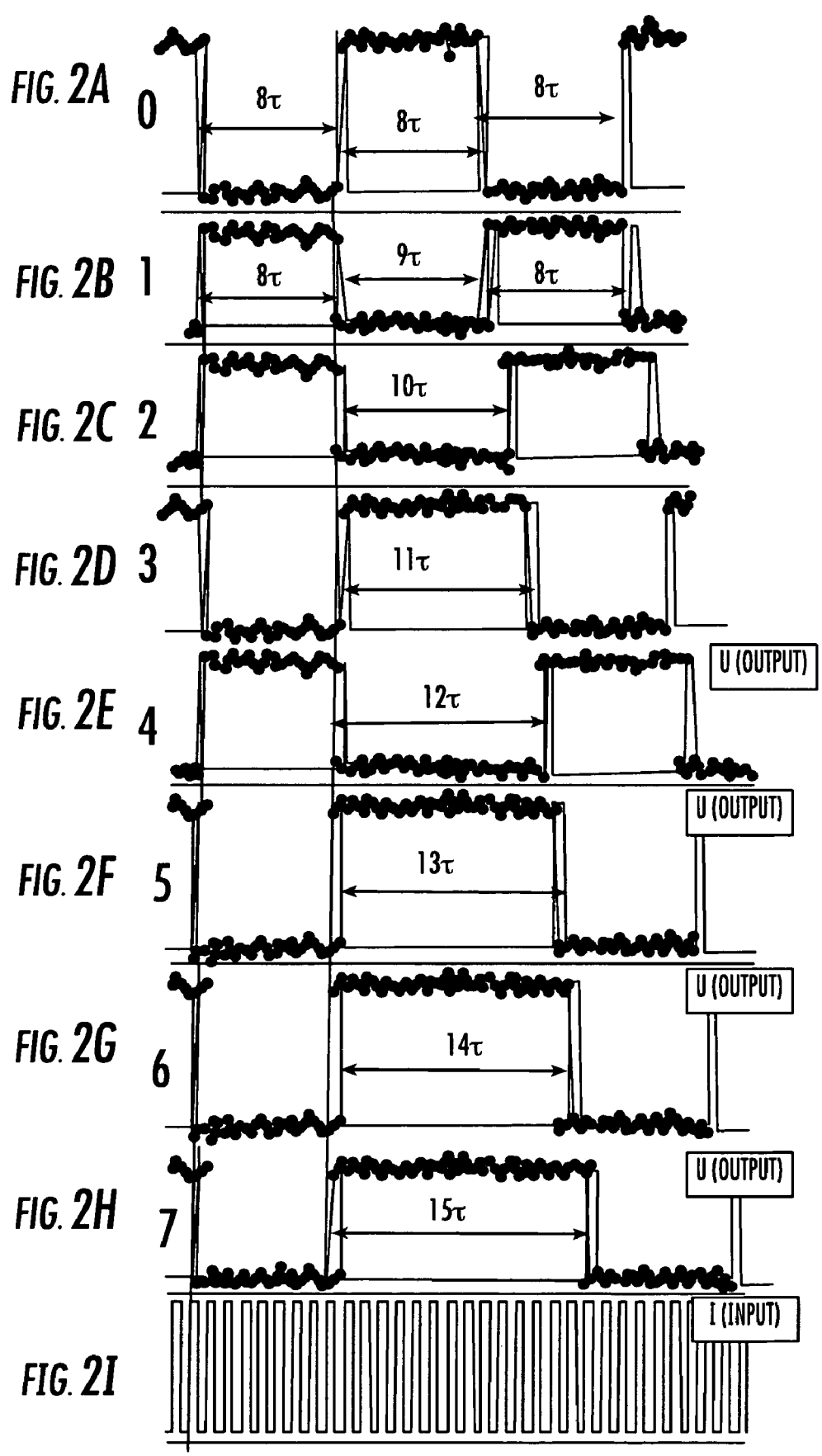

US 7,508,230 B2

DIGITAL PROGRAMMABLE PHASE GENERATOR

STATEMENT REGARDING FEDERALLY FUNDED RESEARCH

This invention was made with Government support under Contract Number N00014-02-C-0005.

BACKGROUND OF THE INVENTION

1. Field of Invention

The invention described herein relates to the field of superconductivity, and more specifically relates to circuits and techniques for implementing digital logic using Josephson junctions.

2. Related Art

Josephson junctions are quantum-mechanical circuit elements of superconducting devices. The Josephson effect in particular results from two superconductors acting to preserve long-range order across a barrier, such as an insulating barrier. With a thin enough barrier, the phase of the electron wave function in one superconductor maintains a fixed relationship with the phase of the wave function in another superconductor. This linking up of phases is called phase coherence.

A Josephson junction is the interface between two superconducting materials separated by a non-superconducting barrier. A current may flow freely within the superconductors but the barrier prevents the current from flowing freely between them. However, a supercurrent may tunnel through the barrier depending on the quantum phase of the superconductors. The amount of supercurrent that may tunnel through the barriers is restricted by the size and substance of the barrier. The maximum value the supercurrent may obtain is called a critical current of the Josephson junction.

Josephson junctions have two basic electrical properties. The first is that the junctions have inductive reactance. That is, similar to inductors, the voltage difference across the junction is related to the time rate of change of the current. The second is that a constant voltage across the junction will produce an oscillating current through the barrier, and vice versa. Thus, Josephson junctions convert a direct current voltage to an alternating current.

A family of logic/memory devices were proposed using Josephson junctions in IEEE Transactions on Applied Superconductivity, Volume 1, Number 1, March 1991, by K. K. Likharev and V. K. Semenov in an article entitled, RSFQ Logic/Memory Family: A New Josephson Junction Technology For Sub-Terahertz-Clock-Frequency Digital Systems. That article is hereby incorporated by reference in its entirety into specification of this application.

RSFQ circuits are widely recognized as the fastest digital circuits in any electronic technology, and this is also true of RSFQ digital phase generators of the prior art. However, the lack of flexible programmability of these prior art phase generator circuits greatly restricted their use within complex digital RSFQ circuits. The circuits of the proposed invention are easily digitally programmable to achieve a wide range of digital phase delays, while maintaining the ultrafast speed of RSFQ circuits.

BRIEF SUMMARY OF THE INVENTION

The invention described herein is related to circuits and techniques for implementing a digital programmable phase generator utilizing Josephson junction technology.

The purpose of the invention is to provide a digital phase generator with controllable phase shift, which overcomes the problems of the prior art.

BRIEF DESCRIPTION OF THE DRAWINGS

FIG. 2, comprising FIGS. 2A through 2H show the decimated clock output wave forms having selected delay provided by the output of the circuit of FIG. 1 and FIG. 2I shows an exemplary frequency reference of FIG. 1.

DETAILED DESCRIPTION OF THE INVENTION

Figure 1:
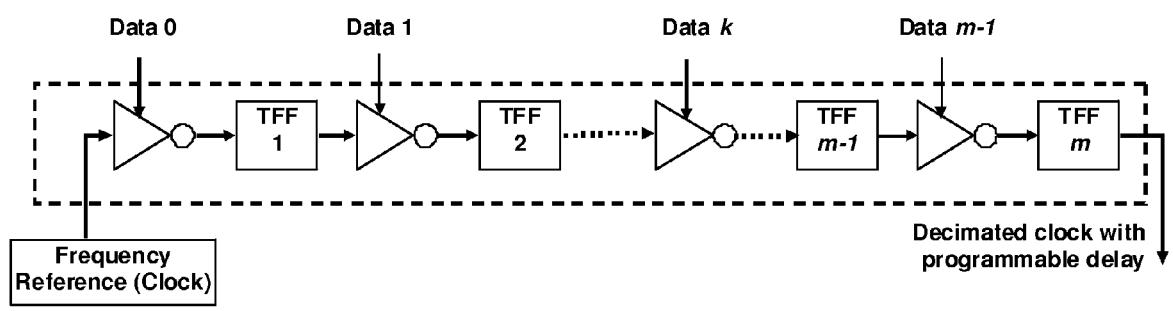
FIG. 1, is a block diagram of a programmable phase generator in accordance with one aspect of the invention.

FIG. 1 is a block diagram of a programmable phase generator in accordance with one aspect of the invention. The programmable phase generator of FIG. 1 uses a Rapid Single Flux Quantum (RSFQ) binary counter comprising a chain of RSFQ toggling flip-flop (TFFs). It decimates the input periodic single-flux-quantum (SFQ) pulse signal by a factor of $2^m$, where m is the number of TFFs. By extracting an SFQ pulse from the k-th stage of the counter, the programmable phase generator delays the output signal by $T \cdot 2^k$, where T is an input pulse sequence period. Thus, it achieves a phase shift of the output sequence by $2\pi \cdot 2^{k-m}$. In order to realize the functionality, an RSFQ inverter is inserted before each toggle flip-flop. The clock input and the data output of each inverter are connected to the output of the preceding TFF and the input of the next TFF respectively. In the absence of a data signal, an inverter stage forwards all clock pulses to its output. When an SFQ pulse is sent to the data input of the inverter, it skips the following clock pulse. Thus, by sending an m-bit binary number N to the data inputs of the device, one achieves a selectable phase shift of the output signal by $2\pi \cdot N \cdot 2^{-m}$.

FIGS. 2(A)-2(I) illustrates the operation of the circuit shown in FIG. 1. FIG. 2(I) shows the reference clock applied to the input of the chain of toggle flip-flops. FIGS. 2(A)-2(H) represent the situation, respectively, when a data pulse is applied at the data 0, 1, 2 ... m−1 input. As can be seen from the respective diagrams, a phase delay of $8\tau+\tau$ times the number of the data input stage results from activation of a data pulse on one of the data k inputs.

Figure 3A:
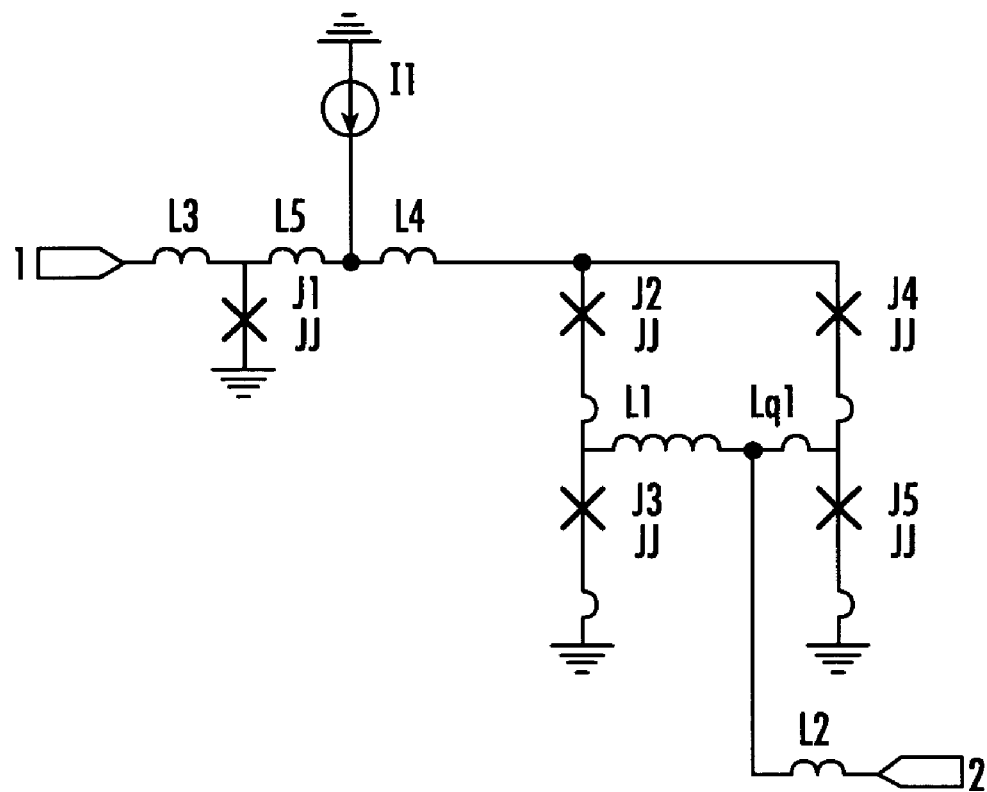
FIG. 3(A), shows a circuit for construction of an RSFQ toggling flip-flop (T flip-flop) as used in the construction of the circuit of FIG. 1.

FIG. 3(A) shows a circuit for construction of a SFQ toggle flip-flop as used in the construction of the circuit of FIG. 1. The operation of this latch is identical to that of an RS flip-flop trigger with joined set and reset inputs. The T flip-flop has 2 stable states: "1" and "0", that is, with and without a magnetic flux quantum stored inside a loop. Every input pulse "T" triggers switching of the latch to the opposite state. When it is in state "0" an incoming SFQ pulse at port "1" switches the T flip-flop to the state "1". When the latch is in state "1" an SFQ pulse at input "1" flips the flip-flop to state "0". The transition "1"->"0" results in appearance of an SFQ pulse at the output "2". Note that the frequency of the output pulses is exactly ½ of the frequency of the input pulses.

The normalized PSCAN units are normalized to 125 μA for junctions critical currents J and bias current values I and to 2.63 pA for inductance values L.

The values of the normalized units for FIG. 3A are J1=2.02, J2=2.46, J3=1.31, J4=1.00, J5=2.04, I1=2.02, L1=1.91, L2=1.80, L3=0.65, L4=0.20, L5=0.16, LQ1=0.16, LJ1=0.11, LJ2=0.30, LJ3=0.06, LJ4=0.15, LJ5=0.07, XST=0.00.

Figure 3B:
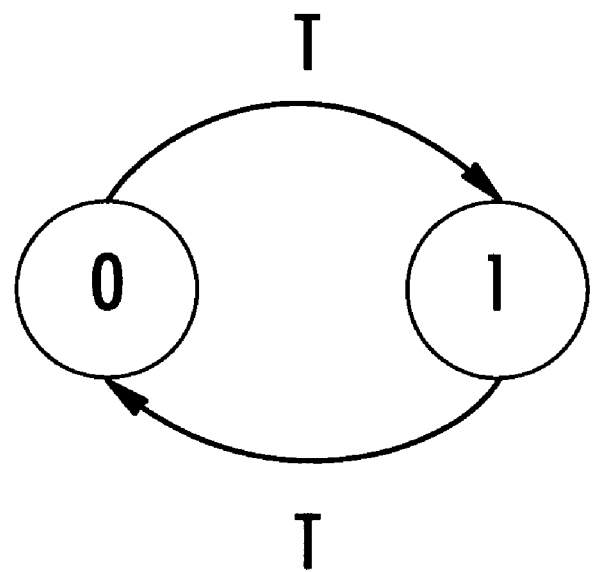
FIG. 3(B), shows a Moore diagram of the .RSFQ toggle flip-flop used in FIG. 1.

FIG. 3(B) shows a Moore diagram of the SFQ T flip-flop used in FIG. 1.

Figure 4A:
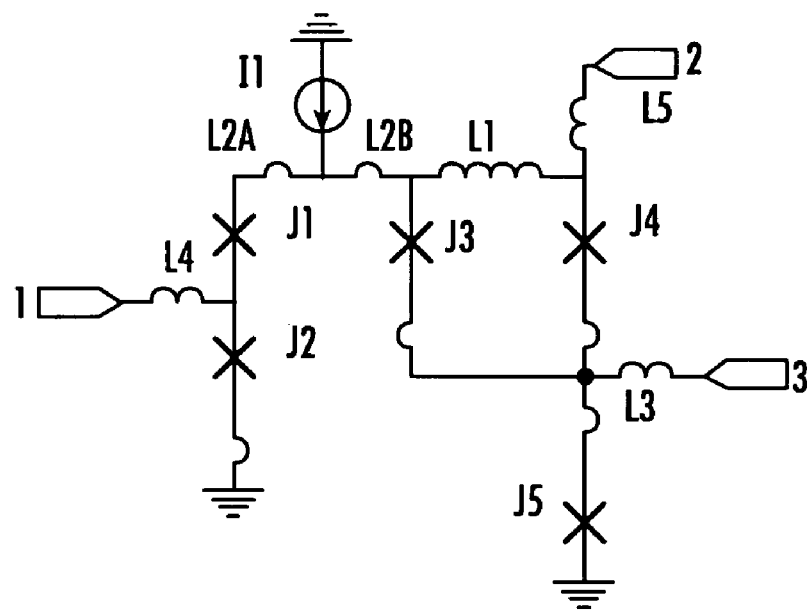
FIG. 4(A), shows a circuit for an RSFQ inverter stage as used in the construction of the circuit of FIG. 1.

FIG. 4(A) shows a circuit for an SFQ inverter as used in the construction of the circuit of FIG. 1. This is a simple inverting latch. If a data pulse arrives then the next clock pulse reads out "0" (no output pulse is produced), otherwise it reads out "1" (output pulse is produced). If more than one data pulses arrive between two clock pulses all except the first one are ignored.

When a pulse arrives on input 1, it is inverted and output on output 3.

The normalized PSCAN values for the circuit of FIG. 4A are as follows: J1=1.93, J2=2.00, J3=1.54, J4=2.28, J5=2.00, I1=2.33, L1=4.12, L2=0.99, L3=2.85, L4=1.50, L5=0.59, LJ1=0.65, LJ2=0.04, LJ3=0.01, LJ4=0.01, LJ5=0.26, LQ1=0.15, XST=0.00.

Figure 4B:
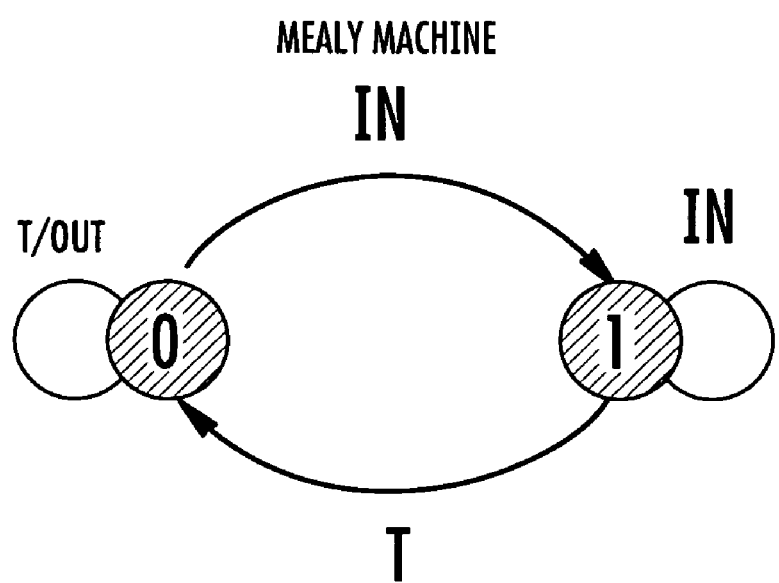
FIG. 4(B), shows a Mealey machine representation of the SFQ inverter shown in FIG. 4(A).

FIG. 4(B) shows a MEALY machine representation of the RSFQ inverter used in FIG. 1.

Figure 5:
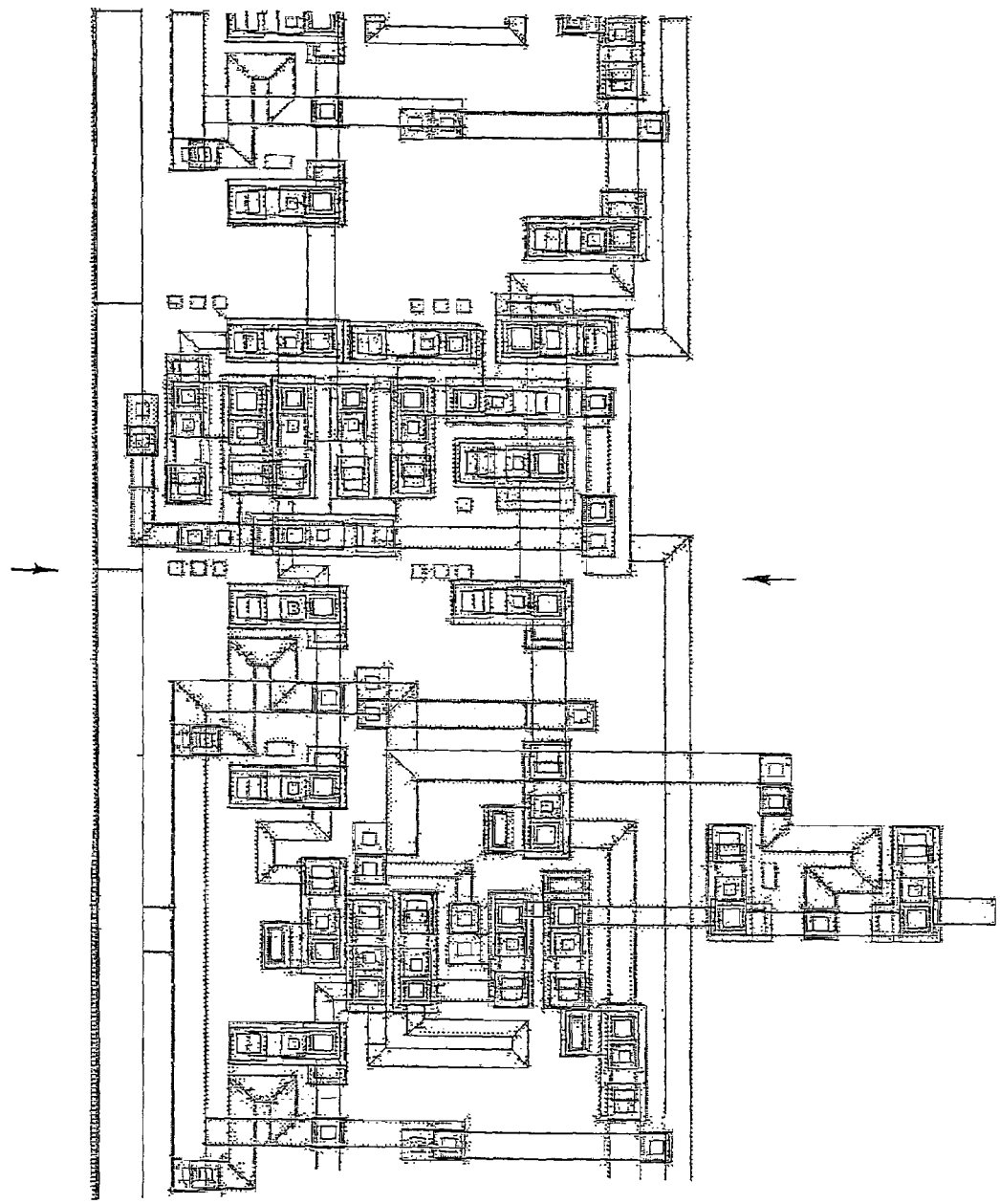
FIG. 5, is an exemplary layout of a repeatable inverter—T flip-flop cell used in constructing the programmable phase generator of FIG. 1.

FIG. 5 shows an exemplary layout of a repeatable inverter—T flip-flop cell used in constructing the programmable phase generator of FIG. 1. This layout has been designed and fabricated using HYPRES'1.0 kA/cm$^2$ process and successfully tested at up to 40 GHz.

While various embodiments of the present invention have been illustrated herein in detail, it should be apparent that modifications and adaptations to those embodiments may occur to those skilled in the art without departing from the scope of the present invention as set forth in the following claims.

What is claimed:

1. A programmable phase shifter comprising Single Flux Quantum (SFQ) logic elements, in which the SFQ logic elements comprise one or more Rapid Single Flux Quantum (RSFQ) T flip-flops connected together by way of an RSFQ inverter.

2. The programmable phase shifter of claim 1 in which one or more RSFQ inverters selectively receive respective signals constituting a digital word specifying the amount of phase shift to apply to an incoming clock signal.

3. The programmable phase shifter of claim 2 in which the signals comprise RSFQ pulses.

4. The programmable phase shifter of claim 1 in which the amount of phase shift to be imparted by the phase shifter is specified by a digital word.

5. The programmable phase shifter of claim 4 in which the digital word comprises N bits, and the phase shifter selectively imparts a respective phase shift for any of $2^N$ states that can be represented by the digital word.

6. The programmable phase shifter of claim 1 in which the SFQ logic elements comprise Josephson junctions.

7. A manufactured device comprising the programmable phase shifter of claim 6.

8. A method of providing a selected phase shift, comprising the steps of:
   a. applying a source having a frequency to an input of a Rapid Single Flux Quantum (RSFQ) logic cell in which a plurality of RSFQ logic cells are conntected in series with the output of one cell connected to the input of another cell and in which an RSFQ logic cell comprises an RSFQ inverter connected in series with an RSFQ T flip-flop;
   b. providing a phase shift to the frequency received at said input, depending upon receipt of a Single Flux Quantum (SFQ) pulse at another input of said cell; and
   c. providing an output from said logic cell that is selectively phase shifted depending on whether said SFQ pulse is received.

9. The method of claim 8 further comprising selectively receiving, at one or more RSFQ logic cells, respective signals constituting a digital word specifying the amount of phase shift to apply to an incoming clock signal.

10. The method of claim 9 in which the signals comprise RSFQ pulses.

11. The method of claim 8 in which the amount of phase shift to be imparted by the phase shifter is specified by a digital word.

12. The method of claim 11 in which the digital word comprises N bits, and the phase shifter selectively imparts a respective phase shift for any of $2^N$ states that can be represented by the digital word.

* * * * *